United States Patent [19]

Scott

[11] Patent Number: 4,652,975
[45] Date of Patent: Mar. 24, 1987

[54] MOUNTING ARRANGEMENT FOR CIRCUIT BREAKER CURRENT SENSING TRANSFORMERS

[75] Inventor: Graham A. Scott, Avon, Conn.

[73] Assignee: General Electric Company, New York, N.Y.

[21] Appl. No.: 856,885

[22] Filed: Apr. 28, 1986

[51] Int. Cl.⁴ .............................................. H05K 1/18
[52] U.S. Cl. .................... 361/404; 339/17 R; 339/17 CF; 336/65; 361/400; 361/419
[58] Field of Search ............... 361/400, 404, 417–420; 336/65, 200, 208; 339/17 M, 17 R, 17 CF; 335/202

[56] References Cited

U.S. PATENT DOCUMENTS

| | | | |
|---|---|---|---|
| 2,965,865 | 12/1960 | Zack | 336/65 X |
| 3,176,062 | 3/1965 | Nordstrom et al. | 336/65 X |
| 3,191,135 | 6/1965 | Hazelquist | 361/419 X |
| 3,479,634 | 11/1969 | Pritulsky | 339/17 R |
| 3,486,077 | 12/1969 | Oeler et al. | 361/400 |
| 3,590,480 | 7/1971 | Johnson, Jr. | 336/65 X |
| 3,701,075 | 10/1972 | Schullstrom et al. | 339/17 CF |
| 3,880,493 | 4/1975 | Lockhart, Jr. | 339/17 CF X |
| 4,039,902 | 8/1977 | Lacan et al. | 361/400 X |
| 4,219,172 | 8/1980 | Murayama | 174/138 G X |
| 4,347,490 | 8/1982 | Peterson | 336/65 X |
| 4,482,877 | 11/1984 | Castonguay et al. | 335/191 |
| 4,535,209 | 8/1985 | Kurz | 361/400 X |
| 4,589,052 | 5/1986 | Dougherty | 361/94 |
| 4,591,942 | 5/1986 | Willard et al. | 361/97 |

OTHER PUBLICATIONS

Neimer et al., Coil Retainer, IBM Tech. Disc. Bull., V. 20 #4, Sep. 1977, p. 1323.

Primary Examiner—R. R. Kucia
Attorney, Agent, or Firm—Richard A. Menelly; Walter C. Bernkopf; Fred Jacob

[57] ABSTRACT

Miniaturized current sensing transformers are electrically and mechanically attached to the printed wiring board carrying the electronic trip unit circuit within molded case circuit breakers. Electrical contacts extending from the current sensing transformers project through openings in the wiring board to springingly engage metal posts extending from the printed wiring board surface. Notched posts mounted on the current sensing transformers, co-extensive with the contacts, snappingly engage the sides of the printed wiring board for good mechanical support and to maintain alignment between the current transformers on the printed wiring board.

9 Claims, 4 Drawing Figures

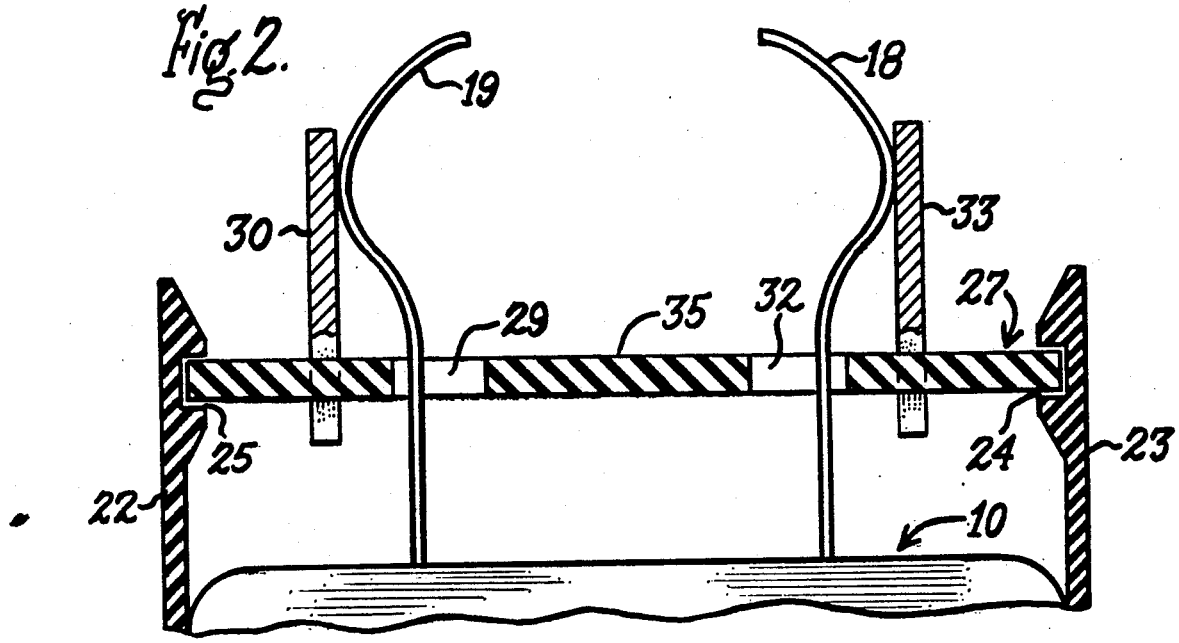
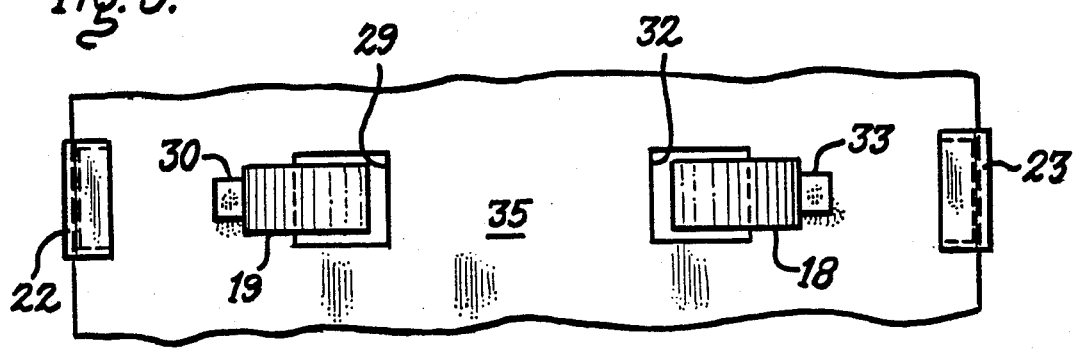

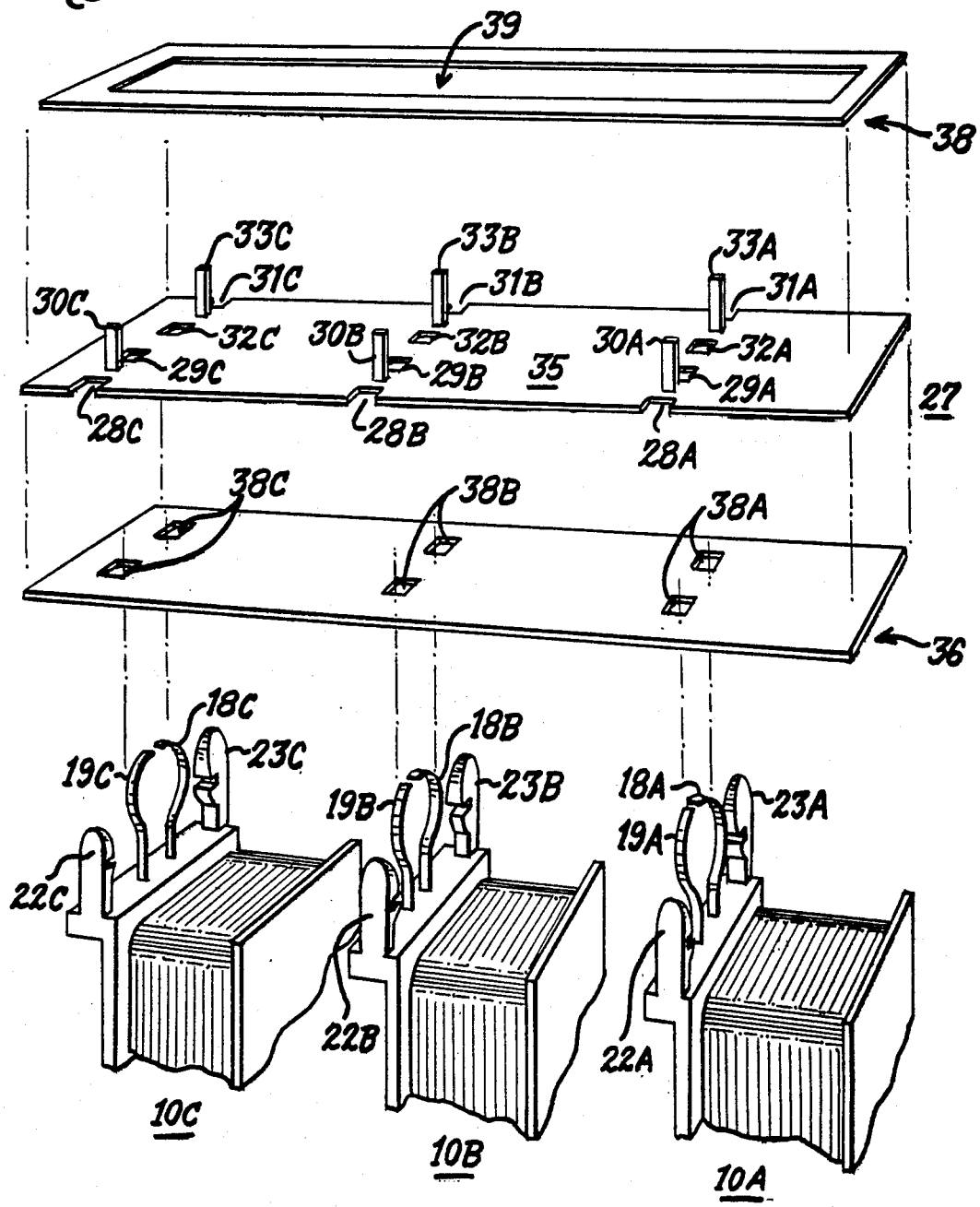

MOUNTING ARRANGEMENT FOR CIRCUIT BREAKER CURRENT SENSING TRANSFORMERS

BACKGROUND OF THE INVENTION

Electronic trip units currently used within industrial circuit breakers rated in excess of 150 amperes and having AC voltages in excess of 600 volts require current sensing transformers in a size proportional to the circuit breaker ampere current rating. U.S. Pat. No. 4,482,877 to Roger Castonguay et al. and the background patents referenced therein describe a molded case industrial rated circuit breaker having an ampere rating in the range of 10–150 amperes and from 120–600 volts AC. Heretofore, it has been economically unfeasible to use an electronic trip unit with smaller sized ampere rated breakers, since size constraints and cost requirements for the current transformers and the electronic circuitry were prohibitive. Recently issued U.S. Pat. No. 4,589,052 to John Dougherty describes a miniaturized electronic trip unit wherein the electronic components are implemented on a printed wiring board and is described as a "Trip Chip". The Dougherty printed wire board readily fits within the lower ampere rated circuit breakers as a replacement for the thermal magnetic units currently employed. U.S. patent application Ser. No. 679,660, filed Dec. 7, 1984 now U.S. Pat. No. 4,591,942, entitled "Current Sensing Transformer Assembly" in the names of H.G. Willard at al., describes a relatively inexpensive current sensing transformer that is economically feasible for use within lower ampere rated breakers. When current sensing transformers are used within the aforementioned higher ampere rated molded case circuit breakers, some additional means of electrical connection is required to connect the current sensing transformers with the electronic trip unit circuit. Male plugs and female receptors or the like are often employed for connection which is difficult to achieve on automated assembly equipment.

The instant invention relates to an economic arrangement for mechanically and electrically interconnecting three such current sensing transformers with a trip chip printed wiring board in a fully automated assembly process without requiring any additional connection means whatsoever.

SUMMARY OF THE INVENTION

A printed wiring board containing electronic trip circuitry for molded case industrial rated circuit breakers carries notched extension posts for engaging complementary edges of the printed wiring board to fixedly support the printed wiring board within the circuit breaker enclosure. A further purpose of the posts in cooperation with slots in the printed wiring board is to provide self-alignment of the electrical controls during the assembly process. In addition, the rigid assembly thereby created comprising the current transformers and the printed wiring board ensures that the alignment and therefore electrical integrity of the electrical connections means is preserved under all operational conditions. Electrical connection with the current sensing transformers is automatically achieved by the insertion of upstanding electrical spring contacts on the current sensing transformer through complementary slots formed within the printed wiring board to engage metal post projections on the printed wiring board to electrically interconnect the current transformer with the trip unit circuit.

BRIEF DESCRIPTION OF THE DRAWINGS

FIG. 2 is a cross-sectional view of the current sensing transformer connected with the printed wiring board depicted in FIG. 1;

FIG. 3 is a plan view of the assembled current sensing transformer and printed wiring board depicted in FIG. 2; and FIG. 4 is a top perspective view of three such current sensing transformer assemblies with the printed wiring board and insulative plastic gaskets in isometric projection therefrom.

DESCRIPTION OF THE PREFERRED EMBODIMENT

Figure 1:
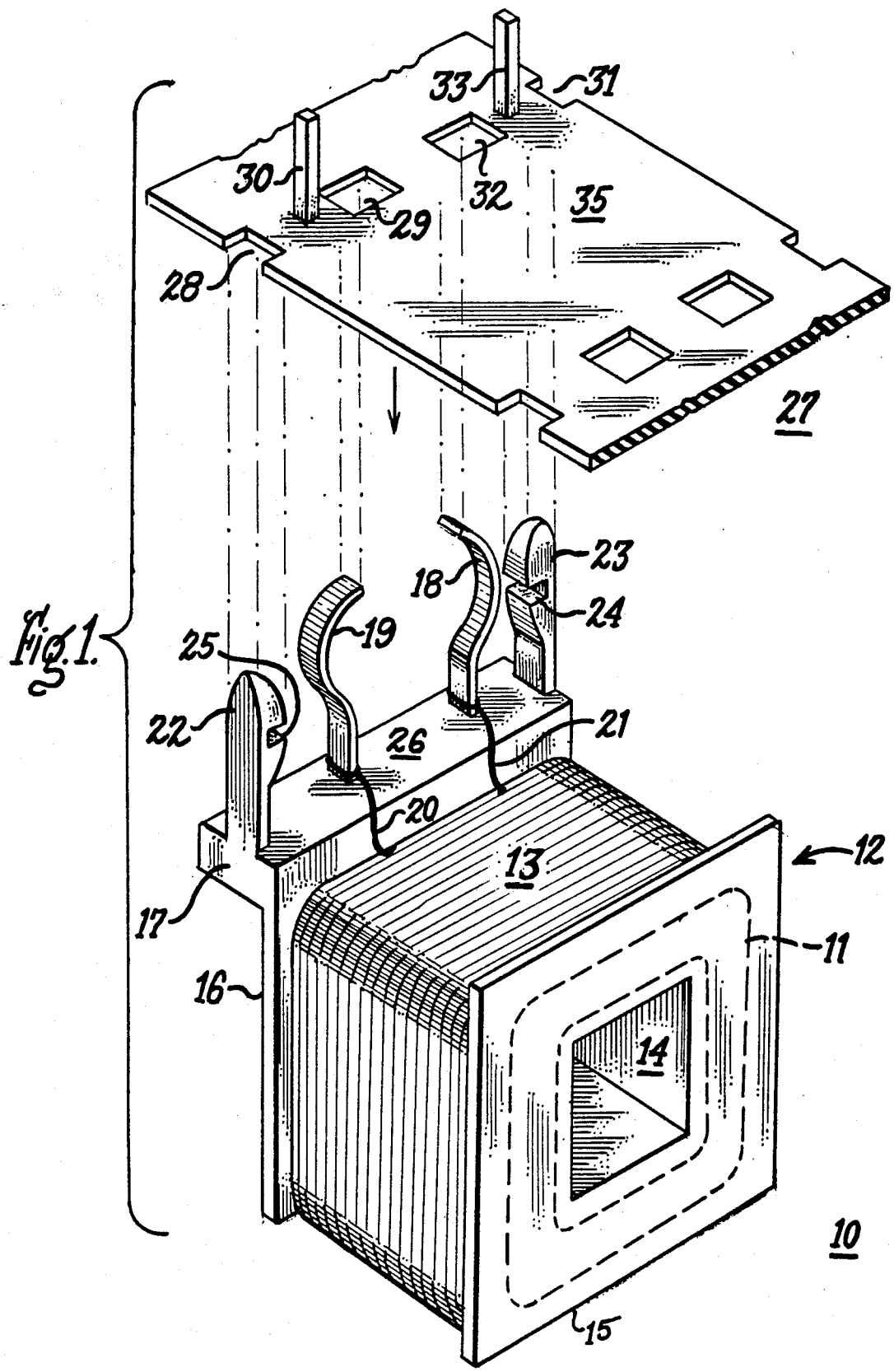
FIG. 1 is a top perspective view of the printed wiring board according to the invention in isometric projection from the inventive current sensing transformer assembly.

A current sensing transformer 10 is shown in FIG. 1 of the type consisting of a core 11 interposed between a planar apertured front plate 15 and an L-shaped apertured back plate 16. The arrangement of the core around a central aperture 14 defines a bobbin 12 for arranging a transformer secondary winding 13, as indicated. For the molded case circuit breakers having the aforereferenced lower ampere ratings, a current transformer having the configuration described within the aforementioned U.S. patent application Ser. No. 679,660, entitled "Current Sensing Transformer Assembly" is employed. The transformer is arranged with an integrally formed ledge 17 as part of the L-shaped back plate 16 and supports a pair of notched posts 22, 23 integrally formed within the back plate and a pair of spring contacts 18, 19 supported within a top surface of the ledge 17 and extending upright therefrom. The spring contacts are embedded within a portion of the top surface of the ledge for support and are electrically connected with the secondary winding by means of wires 20, 21. Slots 24, 25 are formed within the notched posts to receive a slotted printed wiring board 27 in the following manner. The spring contacts 18, 19 are inserted through rectangular openings 29, 32 formed within the printed wiring board and come into contact with a corresponding pair of metal pins 30, 33 to provide electrical connection between the secondary winding and the electronic components, which are assembled on the printed wiring board but are omitted here for purposes of clarity. A pair of opposing slots 28, 31 are formed along the side edges of the printed wiring board for accepting the notched posts 22, 23 and becoming snappingly engaged within the slots 24, 25 formed therein. The entire L-shaped back plate 16 is formed from a molded plastic composition such as polystyrene, which imparts flexibility as well as strength. When such current sensing transformers are used with the miniaturized trip unit circuit described within the aforementioned U.S. Pat. No. 4,589,052, three such transformers are required for RMS as well as peak determination of current. The printed wiring board 27 is therefore equipped with three such pairs of pins, three pairs of such rectangular openings along with three pairs of slots.

FIG. 2 shows the current sensing transformer 10 assembled to the printed wiring board 27 with the spring contacts 18, 19 extending through the rectangular openings 29, 32 into good electrical contact with pins 30, 33. Insulated body 35 of the printed wiring board is fabricated from a glass-filled phenolic composition, which is rigidly supported between the slots 24, 25 within notched posts 22, 23 without distortion. The electrical connection between the pins 30, 33 extending from the printed wiring board body 35 with the spring contacts 18, 19 and the support of the printed wiring board body within the notched posts 22, 23 is shown more clearly in FIG. 3.

As shown in FIG. 4, when three such current sensing transformers 10A–10C are to be assembled and mounted within the aforementioned lower ampere rated circuit breaker described within U.S. Pat. No. 4,482,877, both the printed wiring board 27 and the three current sensing transformers must be electrically insulated from the other electrical components within the breaker as well as being hermetically sealed from the interior of the breaker to prevent contamination of any of the electrical components carried by the current sensing transformers and the printed wiring board. For such insulation purposes, a thick, resilient sheet 36 of polypropylene plastic material having rectangular openings 38A–38C punched therein is first assembled over spring contacts 18A–18C, 19A–19C before inserting these spring contacts through the rectangular openings 32A–32C, 29A–29C formed within the printed wiring board 27. The notched posts 23A–23C, 22A–22C are then fitted over the corresponding slots 31A–31C, 28A–28C before overlaying the entire assembly with a silicone gasket 38 having a longitudinal slot 39 formed therein. Pins 30A–30C, 33A–33C extend through the horizontal slot 39 for electrical access thereto near the top of the molded case circuit breaker prior to assembling the circuit breaker cover (not shown) to the circuit breaker case (also not shown). The completed assembly within the breaker then provides current sensing function to the trip unit circuit components carried by the printed wiring board 27 with good electrical insulation provided by the plastic sheet 36 and good environmental protection provided to the printed wiring board components by means of the silicone gasket 38.

Having thus described my invention, what I claim as new and desire to secure by Letters Patent is:

1. A current sensing transformer assembly for molded case circuit breakers comprising:

a transformer bobbin comprising a front plate and a back plate supporting a transformer core;

a transformer winding around said transformer core and arranged between said front plate and said back plate;

a pair of notched support posts extending from said back plate;

an apertured printed wiring board supported on said notched posts; and a pair of spring contacts electrically connected with said transformer winding and extending from said back plate through said apertured printed wiring board into contact with a corresponding pair of pins extending from said printed wiring board and electrically connected with said printed wiring board for providing electrical connection between said transformer winding and said printed wiring board.

2. The current sensing transformer assembly of claim 1 further including first slot means on said notched support posts and second slot means on said printed wiring board whereby said notched support posts extend through said second slot means and said first slot means engages an edge of said printed wiring board.

3. The current sensing transformer assembly of claim 1 wherein said transformer back plate comprises an integrally formed L-shaped configuration defining a ledge at one end.

4. The current sensing transformer assembly of claim 3 wherein said notched support posts are integrally formed within a top surface of said ledge.

5. The current sensing transformer assembly of claim 3 wherein said spring contacts are attached to said top surface of said ledge.

6. The current sensing transformer assembly of claim 5 wherein said spring contacts comprise a hood-shaped configuration.

7. The current sensing transformer assembly of claim 1 including said apertured printed wiring board attached to three transformer bobbins.

8. The current sensing transformer assembly of claim 1 including a slotted gasket arranged over a top surface of said printed wiring board.

9. The current sensing transformer assembly of claim 1 including a plastic sheet arranged over a top surface of said transformer bobbin.

* * * * *